United States Patent [19]

Sasaki

[11] Patent Number: 4,827,481
[45] Date of Patent: May 2, 1989

[54] LASER DIODE DRIVE SYSTEM FOR MULTITONE IMAGE FORMING APPARATUS

[75] Inventor: Yoshikazu Sasaki, Osaka, Japan

[73] Assignee: Minolta Camera Kabushiki Kaisha, Osaka, Japan

[21] Appl. No.: 228,014

[22] Filed: Aug. 3, 1988

[30] Foreign Application Priority Data

Aug. 5, 1987 [JP] Japan .................................. 62-195642

[51] Int. Cl.$^4$ ................................................ H01S 3/13
[52] U.S. Cl. .......................................... 372/31; 372/38; 372/26; 372/29
[58] Field of Search .................... 372/38, 29, 31, 33, 372/26, 27, 32; 250/205

[56] References Cited

U.S. PATENT DOCUMENTS

| | | | |
|---|---|---|---|
| 4,412,331 | 10/1983 | Chapman | 372/29 |
| 4,516,242 | 5/1985 | Yokota | 372/29 |
| 4,577,320 | 3/1986 | Yoshikawa et al. | 372/29 |
| 4,625,315 | 11/1986 | Lemberger et al. | 372/38 |
| 4,674,003 | 6/1987 | Angerstein et al. | 372/29 |
| 4,733,398 | 3/1988 | Shibagari et al. | 372/38 |
| 4,763,334 | 8/1988 | Shimada et al. | 372/38 |

Primary Examiner—Leon Scott Jr.
Attorney, Agent, or Firm—Price, Gess & Ubell

[57] ABSTRACT

A laser diode drive system suited to a multitone image forming apparatus. For stopping laser emission from a laser diode the laser diode drive system superimposes a signal having a level corresponding to a maximum level of a video signal applied to the laser diode on a detection signal corresponding to emission intensity of the laser diode. A signal formed by the superimposition is used for negative feedback to a laser diode drive circuit.

20 Claims, 3 Drawing Sheets

LASER DIODE DRIVE SYSTEM FOR MULTITONE IMAGE FORMING APPARATUS

BACKGROUND OF THE INVENTION (1) Field of the Invention

The present invention relates to a system for driving a laser diode used as a light source in a laser beam printer or the like, and more particularly to a system for stopping emission from the laser diode in action.

(2) Description of the Prior Art

With a laser beam printer, it is necessary to stop laser emission when the printer is switched on and a video signal is input, for safety's sake and to avoid unnecessary laser emission outside an image forming time.

For this purpose, a known laser beam printer employs an emission stopping circuit system as shown in FIG. 1. This system comprises a laser diode 31, a differential amplifier 32, and a DC supply circuit 33. The differential amplifier 32 and DC supply circuit 33 constitute a laser diode drive circuitry 34. The DC supply circuit 33 supplies direct current above the threshold level to the laser diode 31.

The differential amplifier 32 receives a video signal at one input terminal 32a and a feedback signal at the other input terminal 32b. The video signal is applied to the input terminal 32a of the differential amplifier 32 after undergoing level adjustment through a DC bias voltage circuit 35 for assuring that the laser diode 31 is used only in a laser emission range (above "Do" in FIG. 4). The feedback signal is produced by detecting emission from the laser diode 31 with a PIN photodiode 36 and amplifying the resulting signal with an output monitor circuit 37 comprising a video buffer amplifier. The output monitor circuit 37 amplifies the feedback signal to a level corresponding to one to one relationship with the video signal. Consequently, the feedback signal applied to the input terminal 32b of the differential amplifier 32 causes the laser diode 31 to increase and decrease laser emission following the level of the video signal.

The circuit system further comprises an ON/OFF circuit 38 including a photocoupler 39 and an output transistor 40 for stopping the laser emission. The photocoupler 39 has a light emitting diode 39a for receiving a signal from a CPU, not shown, for controlling the emission from the laser diode 31.

When forward current is applied to the light emitting diode 39a, the diode 39a emits light whereby a phototransistor 39b becomes conductive. With the operation of phototransistor 39b, the base voltage of the transistor 40 drops to zero volts and the transistor 40 becomes nonconductive, whereby the video signal is applied to the input terminal 32a of the differential amplifier 32 in a normal way. When forward current is not applied to the light emitting diode 39a, the diode 39a stops emitting light whereby the phototransistor 39b becomes nonconductive. As a result, the transistor 40 becomes conductive and the input terminal of the differential amplifier 32 is applied to ground through the collector and emitter of transistor 40, whereby the laser diode 31 stopes the emission.

With the above known systems, it is difficult to cause the laser diode 31 to stop the laser emission completely since the laser diode 31 is controlled through the output transistor 40 of the ON/OFF circuit 38. More particularly, even when the output transistor 40 is conductive, its internal resistance maintains the voltage between the collector and the emitter at several millivolts instead of allowing the voltage to fall to zero. Since the collector of the output transistor 40 is connected to the input terminal 32a of the differential amplifier 32 through a point P2, the several millivolts are applied to the differential amplifier 32 as a leakage input. As a result, an output from the differential amplifier 32 is applied to the laser diode 31 even when the video signal is zero. This leakage input causes the laser diode 31 to emit light since the diode 31 is operable by the DC supply circuit 33 even with a slight voltage applied thereto through the differential amplifier 32. The amount of emission in this instance is dependent on the level of leakage input, namely the performance and resistance of the output transistor 40. The amount of emission is also influenced by the maximum input level of the video signal controlled by the DC bias voltage circuit 35. That is, while the video signal level at a point P1 varies from 0V to 2V by reason of the system construction, the maximum level at point P2 may be reduced to half of the level at point P1 or less in order to secure responsivity of the laser diode drive circuitry 34. In such a case, the level of the leakage input applied through the output transistor 40 rises relative to the video signal level at point P2, thereby increasing the amount of leakage emission.

When the above laser diode drive system is applied to a printer, the leakage emission does not always give rise to a problem. This is true where, for example, a sensitive material irradiated by a laser beam to form an image thereon has low sensitivity, or where the sensitive material has high sensitivity but is exposed outside an image forming area to the leakage emission. With the laser beam printer, however, scanning often is repeated numerous times along one line on the sensitive material; the first scan for recording an image and subsequent scans without the laser emission. If leakage emission takes place during the second and subsequent scans, the image area of the sensitive material becomes exposed thereby damaging image quality.

SUMMARY OF THE INVENTION

A primary object of the present invention, therefore, is to provide a laser diode drive system capable of stopping laser emission without causing leakage emission.

Another object of the invention is for use in provide a laser diode drive system suitable to a laser beam printer.

These objects are fulfilled, according to the present invention, by a laser diode drive system for use in an image-forming apparatus for forming a multitone image on a sensitive material by means of a laser beam emitted from a laser diode, comprising detecting means for detecting intensity of the laser beam; drive means for driving the laser diode in response to a multitone analog image signal corresponding to a multitone image to be formed, and modulating the intensity of the laser beam, the drive means including comparing means for comparing the intensity detected by the detecting means with the multitone analog image signal and supplying the laser diode with a current having a level corresponding to a comparison result; stopping signal generating means for generating a stopping signal having a level exceeding a maximum level of the multitone analog image signal; and stopping means for stopping the emission from the laser diode by effecting negative feedback of the stopping signal to the comparing means.

The detecting means may include photoelectric converting means for outputting a detection signal corresponding to the intensity of the laser beam, the detection signal being negatively fed back to the comparing means.

The stopping means may be operable to superimpose the stopping signal on the detection signal provided by the photoelectric converting means for negative feedback to the comparing means.

Further, the stopping means may include an amplifying circuit for amplifying a feedback signal formed by superimposing the stopping signal on the detection signal output from the photoelectric converting means to a level corresponding to the level of the multitone analog image signal.

Preferably, the stopping signal generating means includes a circuit having a transistor and a level adjusting resistor connected in series, the transistor being driven to become conductive for causing the laser diode to stop the laser emission.

The laser diode drive system according to the present invention may further comprise command means for outputting a laser beam emission stop command. Then the stopping means is responsive to the laser beam emission stop command for superimposing the stopping signal on the detection signal to stop the emission from the laser diode.

According to the present invention, the emission from the laser diode is constantly monitored by the detecting means when the emission stopping signal is not generated. Negative feedback of the detecting means output to the comparing means is effected to adjust the amount of laser emission. Consequently, the laser diode varies the amount of emission by following the input signal level.

On the other hand, when the emission stopping signal is generated during the light emission by the laser diode and the signal is superimposed on the monitor output for negative feedback, the feedback portion of the drive system causes the comparing means to stop its output, since the emission stopping signal has a level exceeding a maximum level of the input signal. As a result, the laser diode stops the laser emission. The emission stoppage is effected reliably without leakage emission as experienced in the prior art, as long as the feedback is carried out in a normal way.

BRIEF DESCRIPTION OF THE DRAWINGS

These and other objects, advantages and features of the invention will become apparent from the following description thereof taken in conjunction with the accompanying drawings which illustrate a specific embodiment of the invention. In the drawings.

DESCRIPTION OF THE PREFERRED EMBODIMENT

Figure 1:
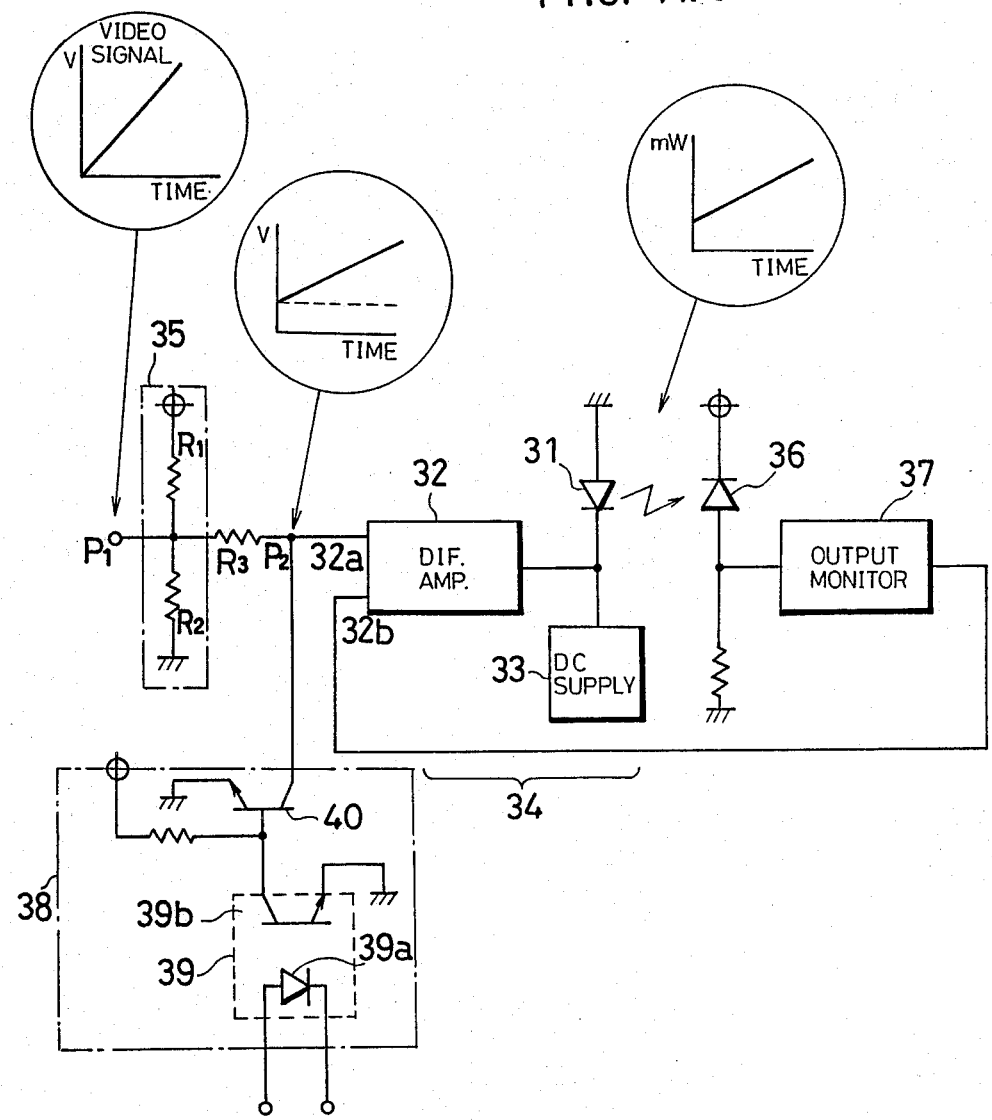
FIG. 1 is a circuit diagram of a laser diode drive system according to the prior art.
Figure 2:
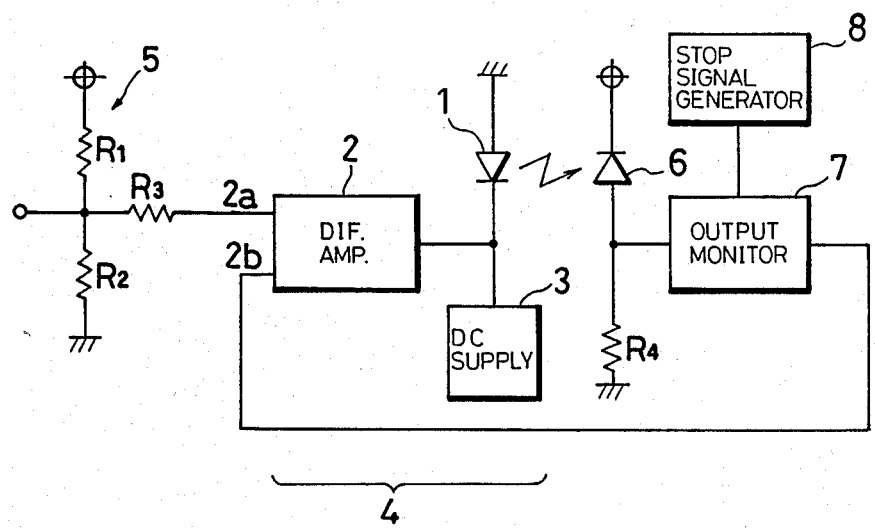
FIG. 2 is a circuit diagram of a laser diode drive system according to the present invention.

FIG. 2 shows an example of laser diode drive system embodying the present invention. This system comprises a laser diode 1, a differential amplifier 2, and a DC supply circuit 3. The differential amplifier 2 and DC supply circuit 3 constitute a laser diode drive circuitry 4. The system further comprises a DC bias voltage circuit 5 including two resistors R1 and R2, a light receiving element 6 comprising a PIN photodiode, and an output monitor circuit 7. The DC supply circuit 3 supplies direct current above the threshold level to the laser diode 1.

Figure 4:
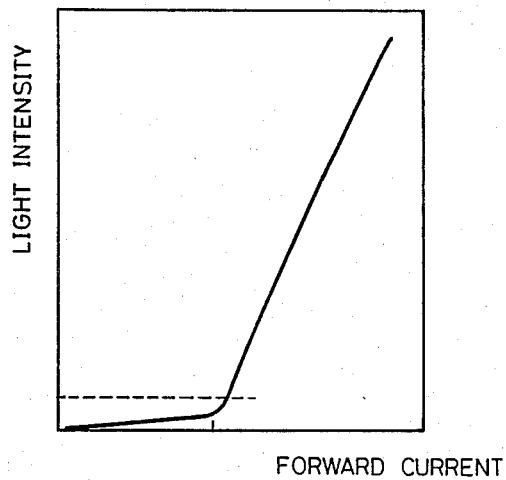
FIG. 4 is a view showing a relationship between laser diode drive current and emission intensity.

The laser diode 1 takes a spontaneous emission state when the current applied to the laser diode 1 is below the threshold level, and a driven emission state when the current exceeds the threshold level. Consequently, the relationship between the current applied to the laser diode 1 and light intensity is non-linear as shown in FIG. 4. In order to effect high-speed analog modulation for the laser diode 1 having such a non-linear characteristic while maintaining linearity between the input signal and light intensity, it is necessary to constantly apply a current exceeding the threshold level Th to the laser diode 1. The DC supply circuit 3 is provided to satisfy this requirement.

The differential amplifier 2 receives a video signal at one input terminal 2a and a feedback signal at the other input terminal 2b. The video signal comprises a multilevel analog signal, and is applied to the input terminal 2a of the differential amplifier 2 after undergoing level adjustment through the DC bias voltage circuit 5 for assuring that the laser diode 1 is used only in a laser emission range. The feedback signal is produced by detecting emission from the laser diode 1 with the PIN photodiode 6 and amplifying the resulting signal with the output monitor circuit 7 comprising a video buffer amplifier. The output monitor circuit 7 amplifies the feedback signal to a level corresponding to a one to one relationship with the video signal. Consequently, the feedback signal applied to the input terminal 2b of the differential amplifier 2 causes the laser diode 1 to modulate the intensity of the laser beam in response to the level of the video signal (analog signal), thereby forming a multitone image on a sensitive material.

Figure 3:
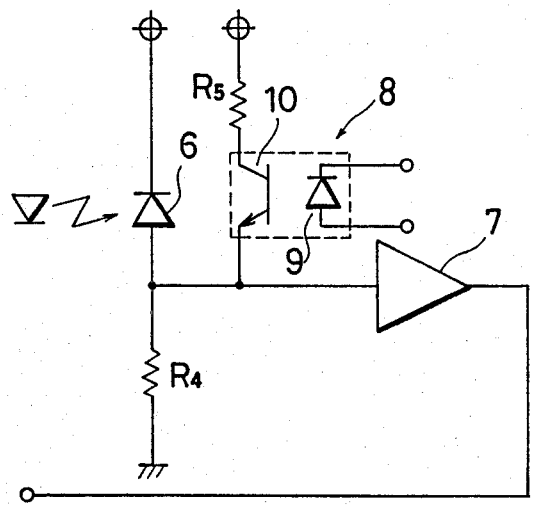
FIG. 3 is a circuit diagram showing a portion of the drive system of FIG. 2.

The circuit system further includes an emission stop signal generating circuit 8 which, for example, comprises a photocoupler as shown in detail in FIG. 3. The photocoupler 8 has a light emitting diode 9 connected to an output port of a CPU not shown. The photocoupler 8 also includes a phototransistor 10 having a collector connected to a DC source through a level adjusting resistor R5 and an emitter connected to an input end of the video buffer amplifier or output monitor circuit 7.

Figure 5A:
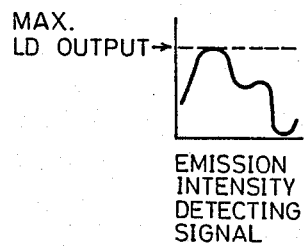
FIG. 5a is a view showing the waveform of an emission intensity detecting signal.
Figure 5B:
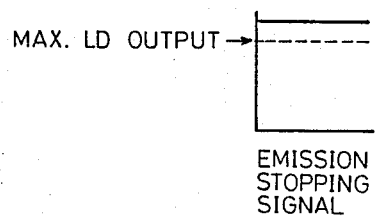
FIG. 5b is a view showing the waveform of an emission stopping signal.

For stopping the laser emission, the unillustrated CPU causes forward current to flow to the light emitting diode 9 for making the phototransistor 10 conductive. Then the resistor R5 is connected in series to a resistor R4, and the voltage resulting from the current flowing through the resistor R5 is superimposed on the voltage generated across the resistor R4 (see FIG. 5a) by the current flowing through the PIN photodiode 6 when the phototransistor 10 is nonconductive. This voltage to be superimposed is adjustable by selecting the resistance of the resistor R5. In the present invention, the resistance of resistor R5 is selected so that the voltage to be superimposed (emission stopping signal) is above a maximum level of the video signal input to the laser diode LD drive circuitry 4 (see FIG. 5b). Consequently, when the phototransistor 10 becomes conductive, the laser diode drive circuitry 4 provides zero output whereby the laser emission is positively stopped.

If, in FIG. 3, the photocoupler 8 comprises a high speed type and clock pulses of the printer are applied to the light emitting diode 9, a laser drive mode is realized wherein the laser emission is stopped with pixel clock cycles of the printer. This is the laser drive mode disclosed in U.S. patent application Ser. No., 38,367 filed earlier in the name of present Applicant, which is effective as a practical method of checking image quality deterioration due to mode hopping noise peculiar to the laser diode. It is also possible, by adjusting the resistance of resistor R5, to reduce the emission level within a range not impairing the effect with respect to the mode hopping noise without stopping the laser emission.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. A laser diode drive system for use in an image-forming apparatus for forming a multitone image on a sensitive material by means of a laser beam emitted from a laser diode, comprising:
   detecting the means for detecting intensity of the laser beam;
   drive means for driving said laser diode in response to a multitone analog image signal corresponding to a multitone image to be formed, and modulating the intensity of the laser beam, said drive means including a comparing means for comparing the intensity detected by said detecting means with said multitone analog image signal and supplying said laser diode with a current having a level corresponding to a comparison result;
   stopping signal generating means for generating a stopping signal having a level exceeding a maximum level of the multitone analog image signal; and
   stopping means for stopping the emission from said laser diode by effecting negative feedback of said stopping signal to said comparing means.

2. A drive system as claimed in claim 1, wherein said detecting means includes photoelectric converting means for outputting a detection signal corresponding to the intensity of the laser beam, said detection signal being negatively fed back to said comparing means.

3. A drive system as claimed in claim 2, wherein said stopping means is operable to superimpose said stopping signal on said detection signal provided by said photoelectric converting means for negative feedback to said compairing means.

4. A drive system as claimed in claim 3, wherein said stopping means includes an amplifying circuit for amplifying a feedback signal formed by superimposing said stopping signal on said detection signal output from said photoelectric converting means to a level corresponding to the level of said multitone analog image signal.

5. A drive system as claimed in claim 3, wherein said stopping signal generating means includes a circuit having a transistor and a level adjusting resistor connected in series, and transistor being driven to become conductive for causing said laser diode to stop the laser emission.

6. A drive system as claimed in claim 3, wherein said comparing means is a differential amplifier.

7. A laser diode drive system for use in an image-forming apparatus for forming a multitone image on a sensitive material by means of a laser beam emitted from a laser diode, comprising:
   light receiving means for detecting the intensity of the laser beam and for outputting a detection signal corresponding to the intensity detected;
   differential amplifier means for modulating the intensity of the laser beam by applying to said laser diode an excitation current corresponding to a difference in level between a multitone analog image signal corresponding to a multitone image to be formed and the detection signal output from said light receiving means;
   stopping signal generating means for generating a stopping signal having a level exceeding a level of the detection signal output from said light receiving means in response to a maximum intensity of the laser beam emitted from said laser diode; and
   stopping means for stopping the emission from said laser diode by effecting negative feedback of said stopping signal to said differential amplifier means.

8. A drive system as claimed in claim 7, further comprising command means for outputting a laser beam emission stop command, said stopping means being responsive to said laser beam emission stop command for superimposing said stopping signal on said detection signal to stop the emission from said laser diode.

9. A drive system as claimed in claim 7, wherein said stopping means includes an amplifying circuit for amplifying a feedback signal formed by superimposing said stopping signal on said detection signal output from said light receiving means to a level corresponding to the level of said multitone analog image signal.

10. A drive system as claimed in claim 8, wherein said stopping signal generating means includes a light emitting diode operable by said command means, and a phototransistor driven to become conductive by light emission from said light emitting diode.

11. A laser diode drive system for use in an image-forming apparatus for forming a multitone image on a sensitive material by means of a laser beam emitted from a laser diode, comprising:
   detecting means for detecting intensity of the laser beam and outputting a detection signal corresponding to the intensity detected;
   voltage applying means for applying a bias voltage exceeding a threshold level of said laser diode to a multitone analog image signal corresponding to a mulitone image to be formed;
   drive means for driving said laser diode and modulating the intensity of the laser beam in response to the multitone analog image signal with the bias voltage applied thereto by said voltage applying means, said drive means including differential amplifier means for comparing the detection signal output from said detecting means with said multitone analog image signal with the bias voltage applied thereto and supplying said laser diode with an electric signal having a level corresponding to a comparison result;
   command means for outputting a laser beam emission stop command;
   stopping signal generating means for generating a stopping signal having a level exceeding a maximum level of the multitone analog image signal; and means responsive to said laser beam emission stop command for superimposing said stopping signal on said detection signal output from said detecting means for negative feedback to said differential amplifier means to stop the emission from said laser diode.

12. A drive system as claimed in claim 11, wherein said detecting means includes photoelectric converting means for outputting a detection signal corresponding to the intensity of the laser beam, said detection signal being negatively fed back to said comparing means.

13. A drive system as claimed in claim 11, further comprising command means for outputting a laser beam emission stop command, said stopping means being responsive to said laser beam emission stop command for superimposing said stopping signal on said detection signal to stop the emission from said laser diode.

14. A laser diode drive system for use in an image-forming apparatus for forming a multitone image on a sensitive material by means of a laser beam emitted from a laser diode, comprising:

a differential amplifier for supplying said laser diode with an excitation current corresponding to a multitone analog image signal input to said differential amplifier;

detecting means for receiving the laser beam emitted from said laser diode and outputting a detection signal corresponding to the intensity of the laser beam;

means for effecting negative feedback of the detection signal output from said detecting means to said differential amplifier;

command means for outputting a stop command for stopping the emission from said laser diode; and means responsive to the stop command output from said command means for effecting negative feedback of a stopping signal having a level exceeding a maximum level of the multitone analog image signal to said differential amplifier to stop the emission from said laser diode.

15. A drive system as claimed in claim 14, wherein said detecting means includes photoelectric converting means for outputting a detection signal corresponding to the intensity of the laser beam, said detection signal being negatively fed back to said comparing means.

16. A drive system as claimed in claim 15, wherein said stopping means is operable to superimpose said stopping signal on said detection signal provided by said photoelectric converting means for negative feedback to said comparing means.

17. A drive system as claimed in claim 16, wherein said stopping means includes an amplifying circuit for amplifying a feedback signal formed by superimposing said stopping signal on said detection signal output from said photoelectric converting means to a level corresponding to the level of said multitone analog image signal.

18. In a laser diode drive and emission stopping system for use in driving a laser diode in an image forming device having detecting means for detecting the intensity of a laser beam output from the laser diode and for outputting an emission intensity signal corresponding to the detected intensity and drive means for driving and modulating the laser diode to emit a laser beam in response to an image signal, and improvement comprising:

emission stopping means for stopping emission of the laser beam from the laser diode by causing the emission intensity signal, from the detecting means, to exceed the maximum possible image signal.

19. The system of claim 18, wherein the detecting means comprises a photoelectric converting means for outputting the emission intensity signal, and an amplifying means for amplifying the emission intensity signal to a level corresponding to the level of the multitone image signal and the emission stopping means includes a stop signal generating circuit, such that the output of the circuit, when superimposed with the emission detection signal output from the photoelectric converting means, causes the amplified emission intensity signal to exceed the level corresponding to the maximum possible multitone image signal level.

20. The system of claim 19, wherein the stop signal generating circuit is comprised of a circuit having a transistor and a level adjusting resistor connected in series, the transistor being driven to become conductive for super-imposing the stop signal with the emission detection signal output from the photoelectric means.

* * * * *